United States Patent
Adachi et al.

(10) Patent No.: US 11,716,903 B2
(45) Date of Patent: Aug. 1, 2023

(54) THERMOELECTRIC CONVERSION ELEMENT, THERMOELECTRIC CONVERSION MODULE, OPTICAL SENSOR, METHOD OF PRODUCING THERMOELECTRIC CONVERSION MATERIAL, AND METHOD OF PRODUCING THERMOELECTRIC CONVERSION ELEMENT

(71) Applicants: SUMITOMO ELECTRIC INDUSTRIES, LTD., Osaka (JP); TOYOTA SCHOOL FOUNDATION, Nagoya (JP)

(72) Inventors: Masahiro Adachi, Osaka (JP); Yoshiyuki Yamamoto, Osaka (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 0 days.

(21) Appl. No.: 17/262,980

(22) PCT Filed: Jul. 4, 2019

(86) PCT No.: PCT/JP2019/026678
§ 371 (c)(1),
(2) Date: Jan. 25, 2021

(87) PCT Pub. No.: WO2020/049852
PCT Pub. Date: Mar. 12, 2020

(65) Prior Publication Data
US 2021/0167270 A1 Jun. 3, 2021

(30) Foreign Application Priority Data
Sep. 3, 2018 (JP) ................................ 2018-164419

(51) Int. Cl.
*H10N 10/17* (2023.01)
*B22F 9/00* (2006.01)
(Continued)

(52) U.S. Cl.
CPC .............. *H10N 10/17* (2023.02); *B22F 9/002* (2013.01); *H10N 10/01* (2023.02); *H10N 10/81* (2023.02); *H10N 10/851* (2023.02)

(58) Field of Classification Search
CPC ......... H01L 35/32; H01L 35/04; H01L 35/14; H01L 35/34; H10N 10/17; H10N 10/01; H10N 10/81; H10N 10/851; B22F 9/00
See application file for complete search history.

(56) References Cited

U.S. PATENT DOCUMENTS 6,506,321 B1 * 1/2003 Yamashita ........ H01L 23/49883
252/521.3
2005/0172994 A1 8/2005 Shutoh et al.
(Continued)

FOREIGN PATENT DOCUMENTS

EP 1 039 556 A1 9/2000
JP H11-274583 A 10/1999
(Continued)

OTHER PUBLICATIONS

JP-2003031860-A, Machine Translation (Year: 2003).*
(Continued)

*Primary Examiner* — Devina Pillay
(74) *Attorney, Agent, or Firm* — Oliff PLC (57) ABSTRACT

A thermoelectric conversion element includes: a thermoelectric conversion material portion composed of a material having a band gap; a first electrode disposed in contact with the thermoelectric conversion material portion; a second electrode disposed in contact with the thermoelectric conversion material portion and disposed to be separated from
(Continued)

the first electrode; and a sealing portion that seals the thermoelectric conversion material portion. A partial pressure of oxygen in a region surrounding the thermoelectric conversion material portion is maintained by the sealing portion so as to be lower than a partial pressure of oxygen in an external air.

8 Claims, 6 Drawing Sheets

(51) Int. Cl.
    *H10N 10/01*     (2023.01)
    *H10N 10/81*     (2023.01)
    *H10N 10/851*     (2023.01)

(56) References Cited

U.S. PATENT DOCUMENTS

| | | | |
|---|---|---|---|
| 2006/0005873 A1* | 1/2006 | Kambe | H01L 35/30 136/211 |
| 2016/0043297 A1 | 2/2016 | Hayakawa et al. | |
| 2016/0126440 A1 | 5/2016 | Adachi et al. | |

FOREIGN PATENT DOCUMENTS

| | | | |
|---|---|---|---|
| JP | 2003-31860 A | | 1/2003 |
| JP | 2003031860 A | * | 1/2003 |
| JP | 2004-356607 A | | 12/2004 |
| JP | 2010-219255 A | | 9/2010 |
| JP | 2011-077536 A | | 4/2011 |
| JP | 2013-140883 A | | 7/2013 |
| WO | 99/22410 A1 | | 5/1999 |
| WO | 2014/155591 A1 | | 10/2014 |
| WO | 2014/196475 A1 | | 12/2014 |

OTHER PUBLICATIONS

Hiroaki Takiguchi et al., "Nano Structural and Thermoelectric Properties of SiGeAu Thin Films", Japanese Journal of Applied Physics, 2011, 50, 041301.

Akinari Matoba et al., "Crystallinity and Thermoelectric Properties of Si/GeB Multilayers Prepared with Si Buffer Layer and SiO2 Substrates", Japanese Journal of Applied Physics, 2009, 48, 061201.

* cited by examiner

THERMOELECTRIC CONVERSION ELEMENT, THERMOELECTRIC CONVERSION MODULE, OPTICAL SENSOR, METHOD OF PRODUCING THERMOELECTRIC CONVERSION MATERIAL, AND METHOD OF PRODUCING THERMOELECTRIC CONVERSION ELEMENT

TECHNICAL FIELD

The present disclosure relates to a thermoelectric conversion element, a thermoelectric conversion module, an optical sensor, a method of producing the thermoelectric conversion material, and a method of producing the thermoelectric conversion element. The present application claims a priority based on Japanese Patent Application No. 2018-164419 filed on Sep. 3, 2018, the entire content of which is incorporated herein by reference.

BACKGROUND ART

In recent years, renewable energy has been drawing attention as clean energy to replace a fossil fuel such as petroleum. Such renewable energy include energy obtained through power generation using solar light, hydraulic power, and wind power, as well as energy obtained through power generation involving thermoelectric conversion using a temperature difference. In the thermoelectric conversion, heat is directly converted into electric power. Hence, an unnecessary waste is not discharged during the conversion. Because the thermoelectric conversion requires no driving unit such as a motor, the thermoelectric conversion has a characteristic to facilitate maintenance of devices.

Efficiency η in converting a temperature difference (heat energy) into electric energy using a material (thermoelectric conversion material) for thermoelectric conversion is given by the following formula (1):

$$\eta = \Delta T/T_h - (M-1)/(M+T_c/T_h) \quad (1)$$

where η represents conversion efficiency, $\Delta T$ represents a difference between $T_h$ and $T_c$, $T_h$ represents a temperature on the high temperature side, $T_c$ represents a temperature on the low temperature side, M equals to $(1+ZT)^{1/2}$, ZT equals to $\alpha^2 ST/\kappa$, ZT represents a dimensionless figure of merit, $\alpha$ represents a Seebeck coefficient, S represents an electric conductivity and x represents a thermal conductivity. The conversion efficiency is a monotonously increasing function of ZT. It is important to increase ZT in developing a thermoelectric conversion material.

For a thermoelectric conversion material, a technique has been reported in which Au nano particles are formed in SiGe (silicon germanium) by heating a layered body obtained by layering Si, Ge, and Au (for example, NPL 1). For a thermoelectric conversion material, a technique has been reported in which Si/GeB is used (for example, NPL 2).

PTL 1 discloses a thermoelectric conversion material in which nano particles including a base material element and a type of element different from the base material element are included in a base material composed of a semiconductor material constituted of the base material element.

CITATION LIST

Non Patent Literature

NPL 1: Hiroaki Takiguchi et al., "Nano Structural and Thermoelectric Properties of SiGeAu Thin Films", Japanese Journal of Applied Physics 50 (2011) 041301

NPL 2: Akinari Matoba et al., "Crystallinity and Thermoelectric Properties of Si/GeB Multilayers Prepared with Si Buffer Layer and $SiO_2$ Substrates", Japanese Journal of Applied Physics 48 (2009) 061201

Patent Literature

PTL 1: WO 2014/196475

SUMMARY OF INVENTION

A thermoelectric conversion element according to the present disclosure includes: a thermoelectric conversion material portion composed of a material having a band gap; a first electrode disposed in contact with the thermoelectric conversion material portion; a second electrode disposed in contact with the thermoelectric conversion material portion and disposed to be separated from the first electrode; and a sealing portion that seals the thermoelectric conversion material portion. A partial pressure of oxygen in a region surrounding the thermoelectric conversion material portion is maintained by the sealing portion so as to be lower than a partial pressure of oxygen in an external air.

DETAILED DESCRIPTION

Problems to be Solved by the Present Disclosure

There has been required a thermoelectric conversion element employing a thermoelectric conversion material having a conversion efficiency higher than that of each of the thermoelectric conversion materials disclosed in NPL 1, NPL 2, and PTL 1. The efficiency of thermoelectric conversion of a thermoelectric conversion material included in a thermoelectric conversion element can be improved when the resistivity of the thermoelectric conversion material can be maintained to be low. The resistivity is a reciprocal of electric conductivity.

In view of the above, it is one of objects to provide: a thermoelectric conversion element having improved efficiency of thermoelectric conversion; a thermoelectric conversion module; an optical sensor; a method of producing the thermoelectric conversion material; and a method of producing the thermoelectric conversion element.

Advantageous Effect of the Present Disclosure

According to the thermoelectric conversion element of the present disclosure, the efficiency of thermoelectric conversion can be improved.

DESCRIPTION OF EMBODIMENTS

First, embodiments of the present disclosure are listed and described. A thermoelectric conversion element according to the present disclosure includes: a thermoelectric conversion material portion composed of a material having a band gap; a first electrode disposed in contact with the thermoelectric conversion material portion; a second electrode disposed in contact with the thermoelectric conversion material portion and disposed to be separated from the first electrode; and a sealing portion that seals the thermoelectric conversion material portion. A partial pressure of oxygen in a region surrounding the thermoelectric conversion material portion is maintained by the sealing portion so as to be lower than a partial pressure of oxygen in an external air.

The thermoelectric conversion element includes the sealing portion that seals the thermoelectric conversion material portion composed of a material having a band gap. The partial pressure of oxygen in the region surrounding the thermoelectric conversion material portion is maintained by the sealing portion so as to be lower than the partial pressure of oxygen in the external air. Therefore, formation of an oxide film on a surface of the material of the thermoelectric conversion material portion can be suppressed as compared with that in the external air. As a result, the resistivity of the thermoelectric conversion material portion can be suppressed from being increased, thereby maintaining ZT to be high. According to such a thermoelectric conversion element, improvement in efficiency of thermoelectric conversion can be attained.

In the thermoelectric conversion element, the thermoelectric conversion material portion may be composed of a semiconductor material containing an amorphous material. Since the band gap of the semiconductor material is larger than that of an electrically conductive material, the Seebeck coefficient can be made large. With the semiconductor material including the amorphous material, thermal conductivity can be made low. Therefore, dimensionless figure of merit ZT can be made large in the thermoelectric conversion material portion included in the thermoelectric conversion element. As a result, improvement in efficiency of thermoelectric conversion can be attained.

In the thermoelectric conversion element, the sealing portion may surround the thermoelectric conversion material portion with the region being interposed between the sealing portion and the thermoelectric conversion material portion. The partial pressure of oxygen in the region may be less than or equal to $2 \times 10^5$ Pa. In this way, formation of an oxide film on a surface of the material of the thermoelectric conversion material portion can be suppressed efficiently. Therefore, high efficiency of thermoelectric conversion can be secured by maintaining the state in which the resistivity of the thermoelectric conversion material portion is low.

In the thermoelectric conversion element, a pressure in the region may be less than or equal to $1 \times 10^{-2}$ Pa. In this way, formation of an oxide film on a surface of the material of the thermoelectric conversion material portion can be suppressed by decreasing the amount of oxygen in the above-described region. Therefore, high efficiency of thermoelectric conversion can be secured by maintaining the state in which the resistivity of the thermoelectric conversion material portion is low. It should be noted that the pressure in the region is preferably more than or equal to $1 \times 10^{-7}$ Pa.

In the thermoelectric conversion element, an inert gas may be sealed in the region. In this way, formation of an oxide film on a surface of the material of the thermoelectric conversion material portion can be suppressed more securely. Therefore, high efficiency of thermoelectric conversion can be secured by maintaining the state in which the resistivity of the thermoelectric conversion material portion is low. Examples of the inert gas include argon gas and nitrogen gas.

In the thermoelectric conversion element, the sealing portion may be composed of a sealing material provided in the region. With the sealing material, the thermoelectric conversion material portion can be suppressed from being brought into contact with oxygen molecules. As a result, formation of an oxide film on a surface of the material of the thermoelectric conversion material portion can be suppressed. Therefore, high efficiency of thermoelectric conversion can be secured by maintaining the state in which the resistivity of the thermoelectric conversion material portion is low. Examples of the material of the sealing material includes an epoxy resin.

In the thermoelectric conversion element, the semiconductor material may have n type conductivity and may include Si, Ge, Fe, and P. According to such a thermoelectric conversion element, improvement in thermoelectric efficiency can be attained by securely maintaining the state in which the resistivity of the thermoelectric conversion material portion is low.

A thermoelectric conversion module according to the present disclosure includes a plurality of the above-described thermoelectric conversion elements. According to the thermoelectric conversion module of the present disclosure, a thermoelectric conversion module having improved efficiency of thermoelectric conversion can be obtained by including the plurality of thermoelectric conversion elements of the present disclosure excellent in the efficiency of thermoelectric conversion.

An optical sensor according to the present disclosure includes: an absorber that absorbs optical energy; and the above-described thermoelectric conversion element of the present disclosure, wherein the first electrode is connected to the absorber.

In such an optical sensor, improvement in the efficiency of thermoelectric conversion is attained in the thermoelectric conversion element. Accordingly, an optical sensor having high sensitivity can be provided.

A method of producing a thermoelectric conversion material according to the present disclosure includes: obtaining powder of an amorphous semiconductor material by performing mechanical alloying in a reducing atmosphere; and forming a pressed powder body by pressing and solidifying the amorphous powder (the powder of the amorphous semiconductor material).

According to such a method of producing the thermoelectric conversion material, the mechanical alloying is performed in the reducing atmosphere. Hence, oxide films can be suppressed from being formed on surfaces of particles of the pressed powder body. By using the pressed powder body obtained in this way, a thermoelectric conversion material having improved efficiency of thermoelectric conversion can be provided.

In the method of producing the thermoelectric conversion material, the mechanical alloying may be performed in a mixed gas of hydrogen and nitrogen with a content ratio of hydrogen being less than or equal to 4 volume %. In this way, an oxide film can be suppressed from being formed in the obtaining of the powder.

A method of producing a thermoelectric conversion element according to the present disclosure includes: obtaining powder of an amorphous semiconductor material by performing mechanical alloying; forming a thermoelectric conversion material portion constituted of a pressed powder body by pressing and solidifying the amorphous powder; heating the thermoelectric conversion material portion while maintaining a state in which a partial pressure of oxygen in an atmosphere to which the thermoelectric conversion material portion is exposed is lower than a partial pressure of oxygen in an external air; and sealing the thermoelectric conversion material portion by a sealing portion such that a partial pressure of oxygen in a region surrounding the thermoelectric conversion material portion becomes lower than the partial pressure of oxygen in the external air.

According to the method of producing the thermoelectric conversion element in the present disclosure, the thermoelectric conversion material portion is heated while maintaining the state in which the partial pressure of oxygen in the atmosphere to which the thermoelectric conversion material portion is exposed is lower than the partial pressure of oxygen in the external air. Hence, oxygen atoms of oxide films on surfaces of particles of the pressed powder body can be diffused into the inside of the particles, thus resulting in thin oxide films on the surfaces of the particles. Accordingly, electric conductivity between the particles of the pressed powder body can be improved, thereby attaining a low resistivity of the thermoelectric conversion material portion. Further, the thermoelectric conversion material portion is sealed by the sealing portion such that the partial pressure of oxygen in the region surrounding the thermoelectric conversion material portion becomes lower than the partial pressure of oxygen in the external air. Hence, oxide films can be suppressed from being formed on the surfaces of the particles of the pressed powder body, thereby maintaining the state in which the resistivity of the thermoelectric conversion material portion is low. Therefore, according to such a method of producing the thermoelectric conversion element, a thermoelectric conversion element having improved efficiency of thermoelectric conversion can be produced.

In the method of producing the thermoelectric conversion element, the mechanical alloying may be performed in a reducing atmosphere. In this way, in the obtaining of the powder of the amorphous semiconductor material, oxide films can be suppressed from being formed on the surfaces of the particles of the pressed powder body. Therefore, a thermoelectric conversion element having a thermoelectric conversion material portion with a low resistivity can be produced.

In the method of producing the thermoelectric conversion element, the mechanical alloying may be performed in a mixed gas of hydrogen and nitrogen with a content ratio of hydrogen being less than or equal to 4 volume %. In this way, in the obtaining of the powder, oxide films can be suppressed from being formed. Therefore, a thermoelectric conversion element having improved thermoelectric efficiency can be produced.

DETAILS OF EMBODIMENTS OF THE PRESENT DISCLOSURE

Next, the following describes one embodiment of a thermoelectric conversion element of the present disclosure with reference to figures. It should be noted that in the below-described figures, the same or corresponding portions are denoted by the same reference characters and are not described repeatedly.

First Embodiment

Figure 1:
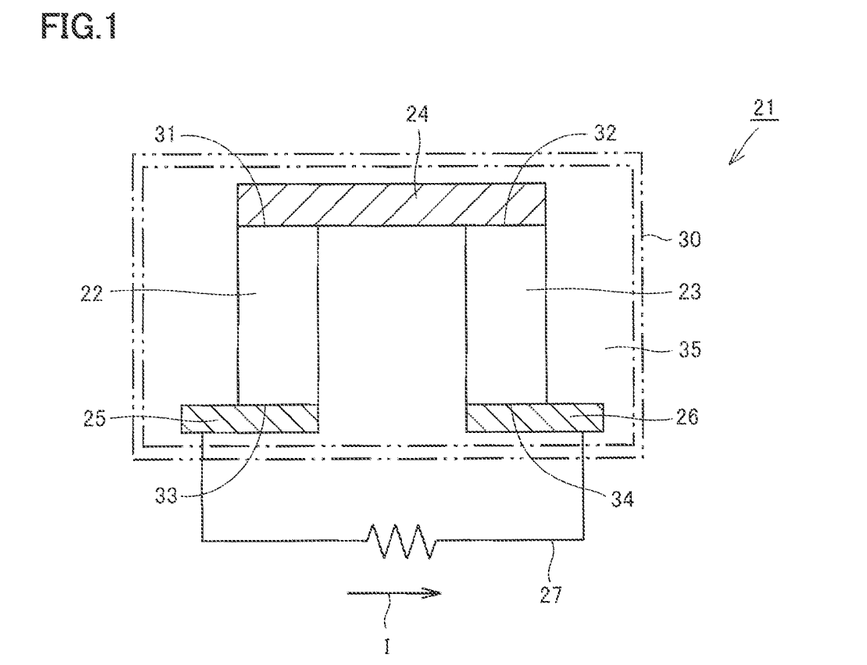
FIG. 1 is a schematic view showing a structure of a π type thermoelectric conversion element (power generation element) serving as a thermoelectric conversion element in a first embodiment.

The following describes a configuration of a thermoelectric conversion element according to a first embodiment of the present application. FIG. 1 is a schematic view showing a structure of a π type thermoelectric conversion element (power generation element) 21 serving as the thermoelectric conversion element in the first embodiment. With reference to FIG. 1, π type thermoelectric conversion element 21 includes: thermoelectric conversion material portions 22, 23 each composed of a material having a band gap, specifically, thermoelectric conversion material portions 22, 23 each constituted of a pressed powder body of a semiconductor material containing an amorphous material; a high temperature side electrode 24 serving as a first electrode disposed in contact with thermoelectric conversion material portions 22, 23; low temperature side electrodes 25, 26 serving as second electrodes disposed in contact with thermoelectric conversion material portions 22, 23 and disposed to be separated from high temperature side electrode 24; and a sealing portion 30 that seals thermoelectric conversion material portions 22, 23. In FIG. 1, sealing portion 30 is schematically shown by a chain double-dashed line. Thermoelectric conversion material portion 22 is a p type thermoelectric conversion material portion 22. Thermoelectric conversion material portion 23 is an n type thermoelectric conversion material portion 23.

Thermoelectric conversion material portion 22 is composed of a thermoelectric conversion material having a component composition adjusted to have p type conductivity, for example. Thermoelectric conversion material portion 22 has p type conductivity because the thermoelectric conversion material of thermoelectric conversion material portion 22 is doped with a p type impurity for generating p type carriers (positive holes), which are majority carriers, for example.

Thermoelectric conversion material portion 23 is composed of the thermoelectric conversion material having a component composition adjusted to have n type conductivity, for example. Thermoelectric conversion material portion 23 has n type conductivity because the thermoelectric conversion material of thermoelectric conversion material portion 23 is doped with an n type impurity for generating n type carriers (electrons), which are majority carriers, for example.

Thermoelectric conversion material portion 22 and thermoelectric conversion material portion 23 are disposed side by side with a space being interposed therebetween. High temperature side electrode 24 is disposed to extend from one end portion 31 of thermoelectric conversion material portion 22 to one end portion 32 of thermoelectric conversion material portion 23. High temperature side electrode 24 is disposed in contact with both one end portion 31 of thermoelectric conversion material portion 22 and one end portion 32 of thermoelectric conversion material portion 23. High temperature side electrode 24 is disposed to connect between one end portion 31 of thermoelectric conversion material portion 22 and one end portion 32 of thermoelectric conversion material portion 23. High temperature side electrode 24 is composed of an electrically conductive material such as a metal. High temperature side electrode 24 is in ohmic contact with thermoelectric conversion material portion 22 and thermoelectric conversion material portion 23.

Low temperature side electrode 25 is disposed in contact with the other end portion 33 of thermoelectric conversion material portion 22. Low temperature side electrode 25 is disposed to be separated from high temperature side electrode 24. Low temperature side electrode 25 is composed of an electrically conductive material such as a metal. Low temperature side electrode 25 is in ohmic contact with thermoelectric conversion material portion 22.

Low temperature side electrode 26 is disposed in contact with the other end portion 34 of thermoelectric conversion material portion 23. Low temperature side electrode 26 is disposed to be separated from high temperature side electrode 24 and low temperature side electrode 25. Low temperature side electrode 26 is composed of an electrically conductive material such as a metal. Low temperature side electrode 26 is in ohmic contact with thermoelectric conversion material portion 23.

Wiring 27 is composed of an electrical conductor such as a metal. Wiring 27 electrically connects between low temperature side electrode 25 and low temperature side electrode 26.

Sealing portion 30 is, for example, a box-shaped member and seals thermoelectric conversion material portions 22, 23. Sealing portion 30 surrounds thermoelectric conversion material portions 22, 23 with a region 35 being interposed therebetween. A partial pressure of oxygen in region 35 surrounding thermoelectric conversion material portions 22, 23 is maintained by sealing portion 30 so as to be lower than a partial pressure of oxygen in an external air. In this embodiment, the pressure in region 35 is less than or equal to $1 \times 10^{-2}$ Pa. Specifically, the pressure in region 35 is maintained to be more than or equal to $1 \times 10^{-7}$ Pa and less than or equal to $1 \times 10^{-2}$ Pa. The inside of region 35 is substantially vacuum. As the material of sealing portion 30, a silicon resin is selected, for example.

In π type thermoelectric conversion element 21, for example, when a temperature difference is formed to attain a high temperature on the side of one end portion 31 of thermoelectric conversion material portion 22 and one end portion 32 of thermoelectric conversion material portion 23 and a low temperature on the side of the other end portion 33 of thermoelectric conversion material portion 22 and the other end portion 34 of thermoelectric conversion material portion 23, p type carriers (positive holes) are moved from the one end portion 31 side toward the other end portion 33 side in thermoelectric conversion material portion 22. On this occasion, in thermoelectric conversion material portion 23, n type carriers (electrons) are moved from the one end portion 32 side toward the other end portion 34 side. As a result, current flows into wiring 27 in a direction of arrow I. In this way, power generation by thermoelectric conversion using the temperature difference is attained in π type thermoelectric conversion element 21. That is, π type thermoelectric conversion element 21 is a power generation element.

Next, the following describes a configuration of thermoelectric conversion material portion 23. Thermoelectric conversion material portion 23 is constituted of a pressed powder body of a semiconductor material containing an amorphous material. In the present embodiment, the semiconductor material employs Si and Ge as base material elements. The semiconductor material includes a first additional element and a second additional element. The semiconductor material includes Fe as the first additional element. Fe forms a first addition level as a new level in a forbidden band (band gap) of SiGe. The semiconductor material includes P as the second additional element. P forms a second addition level between the first addition level and a conduction band in the forbidden band of SiGe. A Fermi level is adjusted by this second addition level. That is, in thermoelectric conversion material portion 23 in the present embodiment, a donor level can be formed by the second addition level. It should be noted that thermoelectric conversion material portion 22 is produced in the same manner as described above with Si, Ge, Au and B being used, for example.

Figure 2:
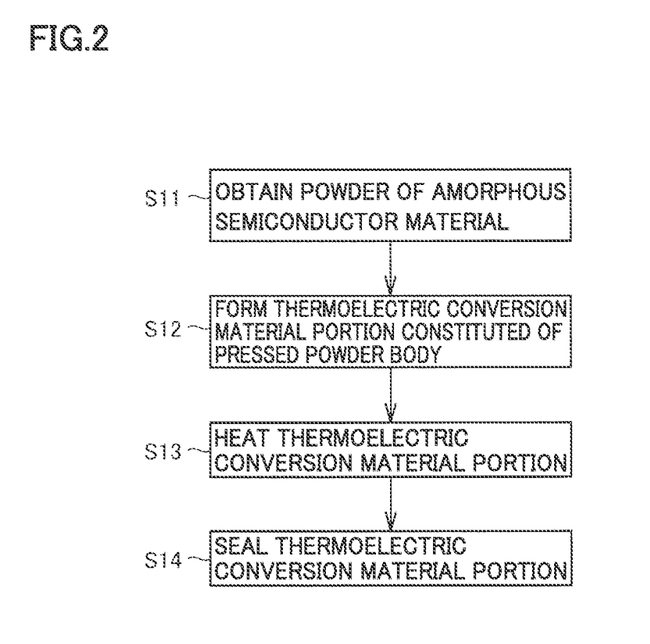
FIG. 2 is a flowchart showing a representative production process of the thermoelectric conversion element.

Thermoelectric conversion element 21 including such thermoelectric conversion material portions 22, 23 is produced as follows. FIG. 2 is a flowchart showing a representative production process of thermoelectric conversion element 21. First, a method of producing n type thermoelectric conversion material portion 23 will be described. With reference to FIG. 2, measured amounts of Si, Ge, Fe, and P are introduced into a pot composed of stainless steel. In this case, the content ratios of the elements are adjusted as follows: $Si_{63}Ge_{24}P_{10}Fe_3$. Moreover, forming gas is introduced into the pot to provide a reducing atmosphere. The forming gas is a mixed gas of hydrogen and nitrogen with the content ratio of hydrogen being less than or equal to 4 volume %. Then, with mechanical alloying, amorphous powder in which Fe and P are added to SiGe is obtained. That is, the mechanical alloying is performed in the mixed gas of hydrogen and nitrogen with the content ratio of hydrogen being less than or equal to 4 volume %. In this way, the powder of amorphous semiconductor material is obtained by performing mechanical alloying in the reducing atmosphere (S11).

Next, with a glove box having a nitrogen gas atmosphere therein, the obtained powder is introduced into a die to form a pressed powder body by a hot pressing method. A pressure on this occasion can be 400 MPa, and a temperature on this occasion can be 400° C. In this way, thermoelectric conversion material portion 23 constituted of the pressed powder body is formed by pressing and solidifying the amorphous powder (S12). In this case, the amorphous powder is pressed and solidified while applying heat. It should be noted that the pressed powder body has become a sintered material on this occasion. These steps S11 and S12 are examples of representative steps in the method of producing the thermoelectric conversion material in the present application. That is, the method of producing the thermoelectric conversion material in the present application includes the steps of: obtaining powder of an amorphous semiconductor material by performing mechanical alloying in a reducing atmosphere; and pressing and solidifying the amorphous powder to form a pressed powder body. It should be noted that thermoelectric conversion material portion 22 is produced in the same manner as described above with Si, Ge, Au, and B being employed and the content ratios of the elements being adjusted.

Next, obtained thermoelectric conversion material portion 23 is heated while maintaining a state in which a partial pressure of oxygen in an atmosphere to which thermoelectric conversion material portion 23 is exposed is lower than a partial pressure of oxygen in an external air (S13). In this case, thermoelectric conversion material portion 23 is disposed and heated in an atmosphere (vacuum) having a pressure of more than or equal to $1 \times 10^{-7}$ Pa and less than or equal to $1 \times 10^{-2}$ Pa. Then, thermoelectric conversion material portion 23 is cooled in an atmosphere having a pressure of more than or equal to $1\times10^{-7}$ Pa and less than or equal to $1\times10^{-2}$ Pa. The same applies to thermoelectric conversion material portion 22.

Next, high temperature side electrode 24, low temperature side electrodes 25, 26, and wiring 27 are attached to thermoelectric conversion material portion 22 and thermoelectric conversion material portion 23. Then, sealing is performed using sealing portion 30. Here, thermoelectric conversion material portions 22, 23 is sealed by sealing portion 30 such that the partial pressure of oxygen in region 35 surrounding thermoelectric conversion material portions 22, 23 becomes lower than the partial pressure of oxygen in the external air (S14). In this case, thermoelectric conversion material portion 22 and thermoelectric conversion material portion 23 having high temperature side electrode 24, low temperature side electrodes 25, 26, and wiring 27 attached thereto is sealed by sealing portion 30 in the atmosphere having a pressure of more than or equal to $1\times10^{-7}$ Pa and less than or equal to $1\times10^{-2}$ Pa. In this way, thermoelectric conversion element 21 including thermoelectric conversion material portions 22, 23 is obtained.

Figure 3:
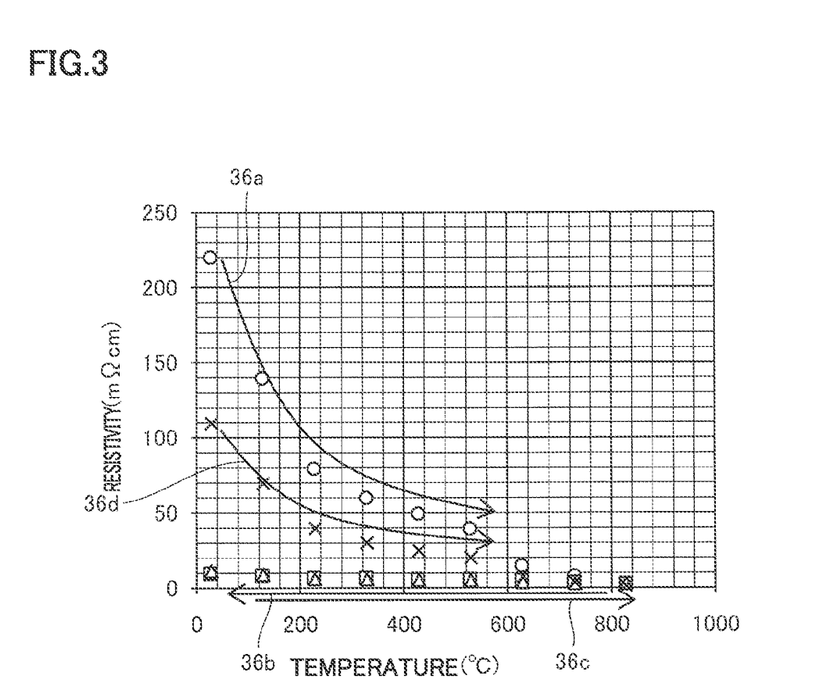
FIG. 3 is a graph showing a relation between temperature and resistivity in a thermoelectric conversion material portion.

FIG. 3 is a graph showing a relation between temperature and resistivity in thermoelectric conversion material portion 23. In FIG. 3, the vertical axis represents a resistivity (mΩcm) and the horizontal axis represents a temperature (° C.). The resistivity is measured by a four-terminal method.

With reference to FIG. 3, it is understandable that the resistivity is decreased significantly by performing heating from a room temperature as indicated by an arrow 36a and circular marks while maintaining the state in which the pressure is more than or equal to $1\times10^{-7}$ Pa and less than or equal to $1\times10^{-2}$ Pa. Specifically, the resistivity, which is 220 mΩcm at the room temperature, is decreased to be less than or equal to 10 mΩcm at a temperature around and more than 700° C. Then, even when thermoelectric conversion material portion 23 is cooled to the room temperature as indicated by an arrow 36b and quadrangular marks while maintaining the state in which the pressure is more than or equal to $1\times10^{-7}$ Pa and less than or equal to $1\times10^{-2}$ Pa, the resistivity is maintained to be about 10 mΩcm. It should be noted that the low resistivity is maintained also during the decrease of the temperature. Next, even when the temperature is increased again to 800° C. as indicated by an arrow 36c and triangular marks while maintaining the state in which the pressure is more than or equal to $1\times10^{-7}$ Pa and less than or equal to $1\times10^{-2}$ Pa, the resistivity is maintained to be less than or equal to 10 mΩcm. On the other hand, when cooling to the room temperature is performed while maintaining the state in which the pressure is more than or equal to $1\times10^{-7}$ Pa and less than or equal to $1\times10^{-2}$ Pa as indicated by an X mark at the room temperature and then thermoelectric conversion material portion 23 is exposed to an external air, the resistivity is increased to about 110 mΩcm. It should be noted that the resistivity is decreased in the following case: after exposing to the external air, the pressure is brought to be more than or equal to $1\times10^{-7}$ Pa and less than or equal to $1\times10^{-2}$ Pa again and the temperature is increased as indicated by an arrow 36d and X marks.

Thus, the low resistivity can be maintained as long as the pressure is maintained to be more than or equal to $1\times10^{-7}$ Pa and less than or equal to $1\times10^{-2}$ Pa. On the other hand, the resistivity becomes large when exposed to the external air. This is presumably due to the following reason: when exposed to the external air, oxide films are formed on surfaces of particles of the pressed powder body. It should be noted that the pressure of $1\times10^{-7}$ Pa results from use of a turbo-molecular pump. The same result was obtained also when an experiment was performed at a pressure of more than or equal to $1\times10^{-11}$ Pa by using an ion pump or a cryopump to decrease the pressure.

According to the method of producing thermoelectric conversion element 21 in the present application, each of thermoelectric conversion material portions 22, 23 is heated while maintaining the state in which the partial pressure of oxygen in the atmosphere to which each of thermoelectric conversion material portions 22, 23 is exposed is lower than the partial pressure of oxygen in the external air. Hence, oxygen atoms of oxide films on surfaces of particles of the pressed powder body can be diffused into the inside of the particles, thus resulting in thin oxide films on the surfaces of the particles. Accordingly, electric conductivity between the particles of the pressed powder body can be improved, thereby attaining a low resistivity of each of thermoelectric conversion material portions 22, 23. Further, each of thermoelectric conversion material portions 22, 23 is sealed by sealing portion 30 such that the partial pressure of oxygen in the region surrounding thermoelectric conversion material portions 22, 23 becomes lower than the partial pressure of oxygen in the external air. Hence, oxide films can be suppressed from being formed on the surfaces of the particles of the pressed powder body, thereby maintaining the state in which the resistivity of each of thermoelectric conversion material portions 22, 23 is low. Therefore, according to such a method of producing thermoelectric conversion element 21, a thermoelectric conversion element 21 having improved efficiency of thermoelectric conversion can be produced.

Moreover, according to the method of producing the thermoelectric conversion material in the present application, the mechanical alloying is performed in the reducing atmosphere. Hence, oxide films can be suppressed from being formed on the surfaces of the particles of the pressed powder body. By using the pressed powder body obtained in this way, a thermoelectric conversion material having improved efficiency of thermoelectric conversion can be provided.

In the present embodiment, the mechanical alloying is performed in the reducing atmosphere. Hence, formation of oxide films can be decreased on the surfaces of the particles of the pressed powder body. By using the pressed powder body obtained in this way, a thermoelectric conversion element 21 having improved efficiency of thermoelectric conversion can be produced.

In the present embodiment, the mechanical alloying is performed in a mixed gas of hydrogen and nitrogen with the content ratio of hydrogen being less than or equal to 4 volume %. Therefore, in the step of obtaining the powder, oxide films can be suppressed from being formed.

It should be noted that the method of producing thermoelectric conversion element 21 may include the steps of: obtaining powder of an amorphous semiconductor material by performing mechanical alloying; forming a thermoelectric conversion material portion 23 constituted of a pressed powder body by pressing and solidifying the amorphous powder; heating thermoelectric conversion material portion 23 while maintaining a state in which a partial pressure of oxygen in an atmosphere to which thermoelectric conversion material portion 23 is exposed is lower than a partial pressure of oxygen in an external air; and sealing thermoelectric conversion material portion 23 by sealing portion 30 such that a partial pressure of oxygen in a region surrounding thermoelectric conversion material portion 23 becomes lower than the partial pressure of oxygen in the external air.

According to such a method of producing thermoelectric conversion element 21, thermoelectric conversion material portion 23 is heated while maintaining a state in which a partial pressure of oxygen in an atmosphere to which thermoelectric conversion material portion 23 is exposed is lower than a partial pressure of oxygen in an external air. Hence, oxygen atoms of oxide films on surfaces of particles of the pressed powder body can be diffused into the inside of the particles, thus resulting in thin oxide films on the surfaces of the particles. Accordingly, electric conductivity between the particles of the pressed powder body can be improved, thereby attaining a low resistivity of the thermoelectric conversion material portion. Moreover, thermoelectric conversion material portion 23 is sealed by sealing portion 30 such that the partial pressure of oxygen in the region surrounding thermoelectric conversion material portion 23 becomes lower than the partial pressure of oxygen in the external air. Hence, oxide films can be suppressed from being formed on the surfaces of the particles of the pressed powder body, thereby maintaining the state in which the resistivity of thermoelectric conversion material portion 23 is low. Therefore, according to such a method of producing thermoelectric conversion element 21, a thermoelectric conversion element 21 having improved efficiency of thermoelectric conversion can be produced.

In the present embodiment, thermoelectric conversion element 21 includes sealing portion 30 that seals thermoelectric conversion material portions 22, 23. The partial pressure of oxygen in the region surrounding each of thermoelectric conversion material portions 22, 23 is maintained by sealing portion 30 so as to be lower than a partial pressure of oxygen in an external air. Therefore, formation of oxide films on the surfaces of the particles of the pressed powder body can be suppressed as compared with that in the external air. As a result, the resistivity of each of thermoelectric conversion material portions 22, 23 can be suppressed from being increased, thereby maintaining high ZT. According to such a thermoelectric conversion element 21, improvement in the efficiency of thermoelectric conversion can be attained.

In the present embodiment, each of thermoelectric conversion material portions 22, 23 is composed of the semiconductor material containing the amorphous material. Specifically, each of thermoelectric conversion material portions 22, 23 is constituted of the pressed powder body of the semiconductor material containing the amorphous material. Since the band gap of the semiconductor material is larger than the conductive material, the Seebeck coefficient can be made large. With the semiconductor material containing the amorphous material, thermal conductivity can be made low. Therefore, dimensionless figure of merit ZT can be made large in each of thermoelectric conversion material portions 22, 23 included in thermoelectric conversion element 21. As a result, improvement in efficiency of thermoelectric conversion can be attained.

In the present embodiment, the pressure in region 35 is more than or equal to $1 \times 10^{-7}$ Pa and less than or equal to $1 \times 10^{-2}$ Pa. Therefore, by decreasing the amount of oxygen in region 35, oxide films can be suppressed from being formed on the surfaces of the particles of the pressed powder body. As a result, high efficiency of thermoelectric conversion can be secured by maintaining the state in which the resistivity of each of thermoelectric conversion material portions 22, 23 is low.

The semiconductor material of thermoelectric conversion material portion 23 has n type conductivity and includes Si, Ge, Fe, and P. According to such a thermoelectric conversion element 21, improvement in thermoelectric efficiency can be attained by securely maintaining the state in which the resistivity of thermoelectric conversion material portion 23 is low.

It should be noted that in the above-described embodiment, the semiconductor material employs Si and Ge as the base material elements but is not limited thereto. A SiGe-based material may be employed. The SiGe-based material refers to SiGe and a material in which other element(s) such as C and/or Sn substitute for part of at least one of Si and Ge in SiGe. Moreover, the semiconductor material may be a MnSi-based material. The MnSi-based material refers to MnSi and a material in which other element(s) such as Al and/or W substitute for part of at least one of Mn and Si in MnSi. Further, the semiconductor material may be a SnSe-based material. The SnSe-based material refers to SnSe and a material in which other element(s) substitute for part of at least one of Sn and Se in SnSe. Further, the semiconductor material may be a $Cu_2Se$-based material. The $Cu_2Se$-based material refers to $Cu_2Se$ and a material in which other element(s) substitute for part of at least one of Cu and Se in $Cu_2Se$. Moreover, the first additional element may not be included. The second additional element may not be included.

Moreover, in the embodiment, each of thermoelectric conversion material portions 22, 23 is composed of the semiconductor material, specifically, each of thermoelectric conversion material portions 22, 23 is constituted of the pressed powder body of the semiconductor material containing the amorphous material; however, it is not limited thereto. Each of thermoelectric conversion material portions 22, 23 may be composed of, for example, an electrically conductive material as long as the material has a band gap. A semiconductor material containing an amorphous material is more suitable. Also in this way, formation of an oxide film on a surface of the material of each of thermoelectric conversion material portions 22, 23 can be suppressed as compared with that in the external air. As a result, the resistivity of each of thermoelectric conversion material portions 22, 23 can be suppressed from being increased, thereby maintaining ZT to be high. According to such a thermoelectric conversion element 21, improvement in the efficiency of thermoelectric conversion can be attained.

In the above-described embodiment, after heating (S13) obtained thermoelectric conversion material portions 22, 23 while maintaining the state in which the partial pressure of oxygen in the atmosphere to which each of thermoelectric conversion material portions 22, 23 is exposed is lower than the partial pressure of oxygen in the external air, each of thermoelectric conversion material portions 22, 23 is sealed (S14) by sealing portion 30 such that the partial pressure of oxygen in region 35 surrounding each of thermoelectric conversion material portions 22, 23 becomes lower than the partial pressure of oxygen in the external air. However, steps S13 and S14 may be performed in a reversed order. That is, after sealing (S14) each of thermoelectric conversion material portions 22, 23 by sealing portion 30 such that the partial pressure of oxygen in region 35 surrounding each of thermoelectric conversion material portions 22, 23 becomes lower than the partial pressure of oxygen in the external air, each of obtained thermoelectric conversion material portions 22, 23 may be heated (S13) while maintaining the state in which the partial pressure of oxygen in the atmosphere to which thermoelectric conversion material portions 22, 23 is exposed is lower than the partial pressure of oxygen in the external air. In this case, a member having durability even when the temperature is high due to heating is employed for sealing portion 30. Alternatively, while heating (S13) obtained thermoelectric conversion material portions 22, 23 while maintaining the state in which the partial pressure of oxygen in the atmosphere to which each of thermoelectric conversion material portions 22, 23 is exposed is lower than the partial pressure of oxygen in the external air, each of thermoelectric conversion material portions 22, 23 may be sealed (S14) by sealing portion 30 such that the partial pressure of oxygen in region 35 surrounding each of thermoelectric conversion material portions 22, 23 becomes lower than the partial pressure of oxygen in the external air. That is, steps S13 and S14 may be performed in parallel.

In the embodiment, the pressure in region 35 is more than or equal to $1 \times 10^{-7}$ Pa and less than or equal to $1 \times 10^{-2}$ Pa; however, it is not limited thereto. The partial pressure of oxygen in the atmosphere in region 35 may be less than or equal to $2 \times 10^5$ Pa. In this way, formation of oxide films on surfaces of the particles of the pressed powder body can be suppressed efficiently. Therefore, high efficiency of thermoelectric conversion can be secured by maintaining the state in which the resistivity of each of thermoelectric conversion material portions 22, 23 is low.

In the above-described embodiment, an inert gas may be sealed in region 35. In this way, formation of oxide films on surfaces of the particles of the pressed powder body can be suppressed more securely. Therefore, high efficiency of thermoelectric conversion can be secured by maintaining the state in which the resistivity of each of thermoelectric conversion material portions 22, 23 is low. Examples of the inert gas include argon gas and nitrogen gas.

In the above-described embodiment, the π type thermoelectric conversion element has been described as an exemplary thermoelectric conversion element of the present application; however, the thermoelectric conversion element of the present application is not limited thereto. The thermoelectric conversion element of the present application may be a thermoelectric conversion element having a different structure, such as an I type (uni-leg type) thermoelectric conversion element.

Second Embodiment

By electrically connecting a plurality of π type thermoelectric conversion elements 21, a power generation module serving as a thermoelectric conversion module can be obtained. A power generation module 41, which is a thermoelectric conversion module of the present embodiment, has a structure in which a plurality of π type thermoelectric conversion elements 21 are connected in series.

Figure 4:
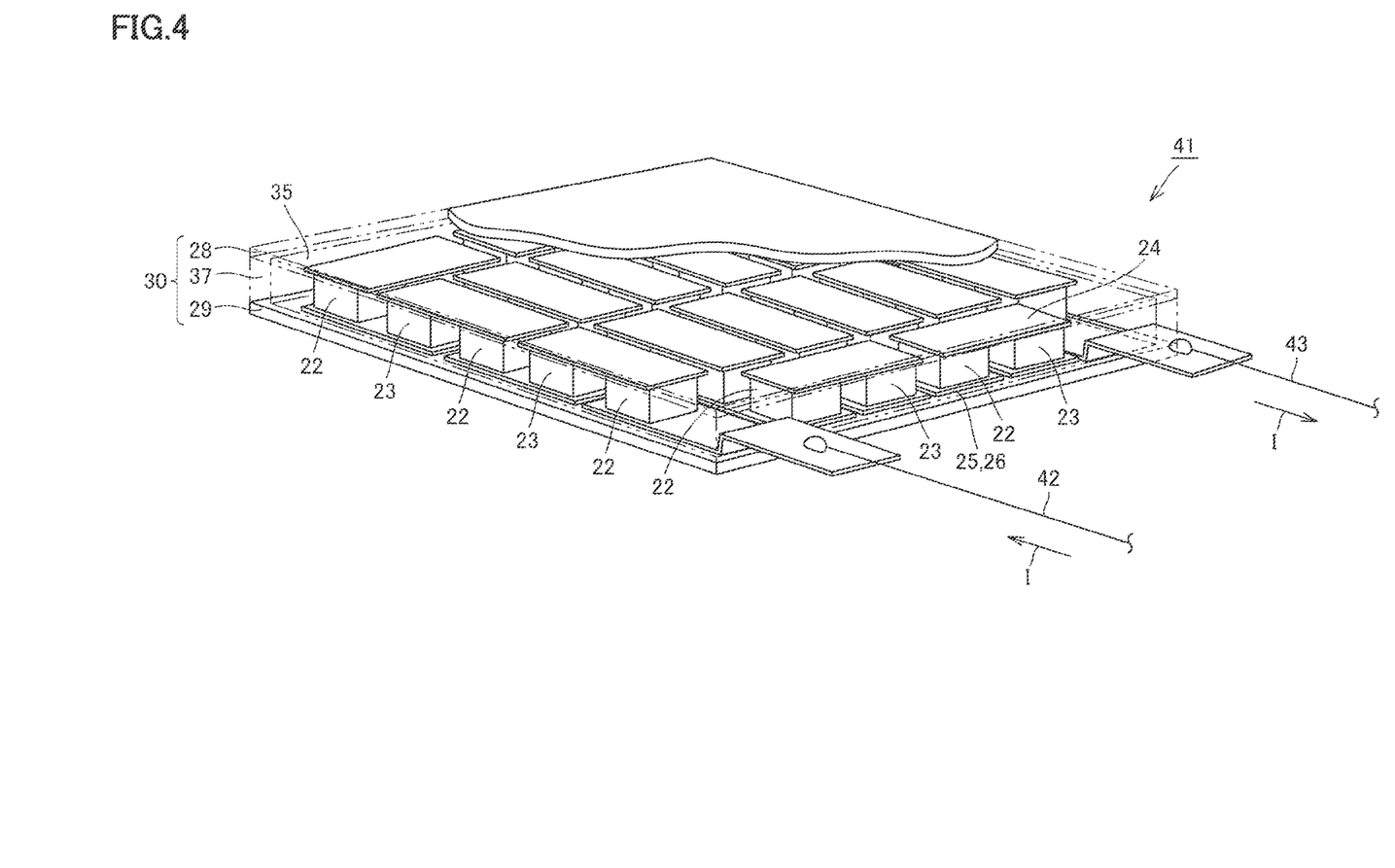
FIG. 4 shows an exemplary structure of a power generation module in a second embodiment.
Figure 5:
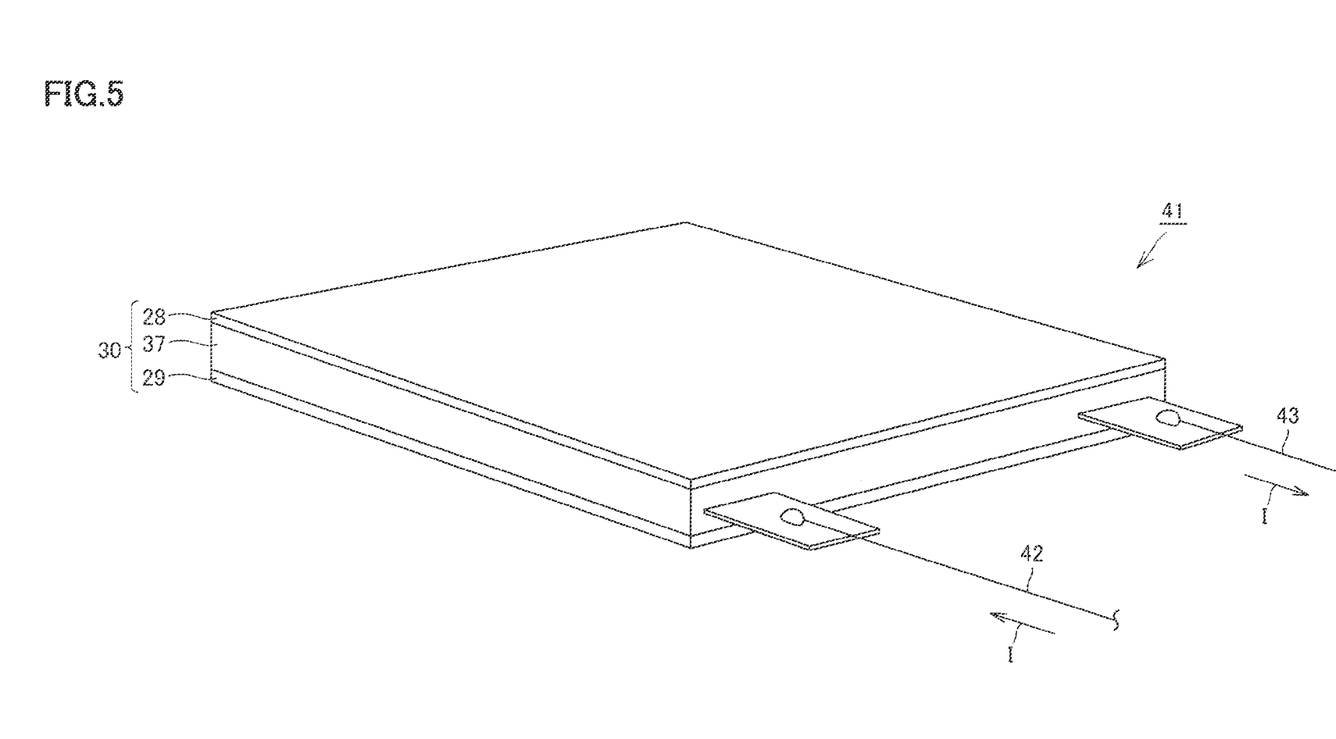
FIG. 5 shows an exemplary structure of a power generation module in the second embodiment.

Each of FIG. 4 and FIG. 5 shows an exemplary structure of a power generation module 41 in a second embodiment. In order to facilitate understanding, in FIG. 4, parts of configurations are not shown and shapes thereof are indicated by chain double-dashed lines.

With reference to FIG. 4, power generation module 41 of the present embodiment includes p type thermoelectric conversion material portions 22, n type thermoelectric conversion material portions 23, low temperature side electrodes 25, 26, high temperature side electrodes 24, a low temperature side insulator substrate 29, a high temperature side insulator substrate 28, and a frame body 37. Each of low temperature side insulator substrate 29 and high temperature side insulator substrate 28 is composed of a ceramic such as alumina. Thermoelectric conversion material portions 22 and thermoelectric conversion material portions 23 are alternately disposed side by side. As with π type thermoelectric conversion element 21 described above, each of low temperature side electrodes 25, 26 is disposed in contact with thermoelectric conversion material portion 22 and thermoelectric conversion material portion 23. As with π type thermoelectric conversion element 21 described above, each of high temperature side electrodes 24 is disposed in contact with thermoelectric conversion material portion 22 and thermoelectric conversion material portion 23. Each thermoelectric conversion material portion 22 is connected to an adjacent thermoelectric conversion material portion 23 on one side by a common high temperature side electrode 24. Moreover, each thermoelectric conversion material portion 22 is connected to an adjacent thermoelectric conversion material portion 23 on a side different from the one side by common low temperature side electrodes 25, 26. In this way, all the thermoelectric conversion material portions 22 and thermoelectric conversion material portions 23 are connected in series.

Low temperature side insulator substrate 29 is disposed on the side of each of low temperature side electrodes 25, 26 that are each in the form of a plate, the side being opposite to the side thereof in contact with thermoelectric conversion material portion 22 and thermoelectric conversion material portion 23. One low temperature side insulator substrate 29 is disposed for the plurality of (all the) low temperature side electrodes 25, 26. High temperature side insulator substrate 28 is disposed on the side of each of high temperature side electrodes 24 that are each in the form of a plate, the side being opposite to the side thereof in contact with thermoelectric conversion material portion 22 and thermoelectric conversion material portion 23. One high temperature side insulator substrate 28 is disposed for the plurality of (all the) high temperature side electrodes 24.

Frame body 37 is constituted of a frame-shaped member having a certain thickness along the external shape of low temperature side insulator substrate 29. Frame body 37 has a quadrangular tubular shape. Frame body 37 is composed of a material such as a silicon resin. Frame body 37 is attached and interposed between low temperature side insulator substrate 29 and high temperature side insulator substrate 28. In this case, frame body 37 is joined to each of low temperature side insulator substrate 29 and high temperature side insulator substrate 28. Thermoelectric conversion material portions 22, 23, low temperature side electrodes 25, 26, and high temperature side electrodes 24 are disposed in region 35 surrounded by low temperature side insulator substrate 29, high temperature side insulator substrate 28, and frame body 37. Sealing portion 30 included in thermoelectric conversion element 21 in the present embodiment is constituted of low temperature side insulator substrate 29, high temperature side insulator substrate 28, and frame body 37. The pressure in region 35 is more than or equal to $1 \times 10^{-7}$ Pa and less than or equal to $1 \times 10^{-2}$ Pa (vacuum), for example.

Wirings 42, 43 are connected to high temperature side electrode 24 or low temperature side electrodes 25, 26 in contact with thermoelectric conversion material portion 22 or thermoelectric conversion material portion 23 located at respective ends among thermoelectric conversion material portions 22 and thermoelectric conversion material portions 23 connected in series. When a temperature difference is formed to attain a high temperature on the high temperature side insulator substrate 28 side and a low temperature on the low temperature side insulator substrate 29 side, current flows in a direction of arrow I by thermoelectric conversion material portions 22 and thermoelectric conversion material portions 23 connected in series, as with π type thermoelectric conversion element 21. In this way, power generation by thermoelectric conversion using the temperature difference is attained in power generation module 41.

Power generation module 41 includes a plurality of thermoelectric conversion elements 21 described above. Here, since power generation module 41 includes the plurality of thermoelectric conversion elements 21 of the present application excellent in the efficiency of thermoelectric conversion, there can be obtained a power generation module serving as a thermoelectric conversion module and having improved efficiency of thermoelectric conversion. It should be noted that an inert gas may be sealed in region 35 shown in FIG. 4.

Third Embodiment

Figure 6:
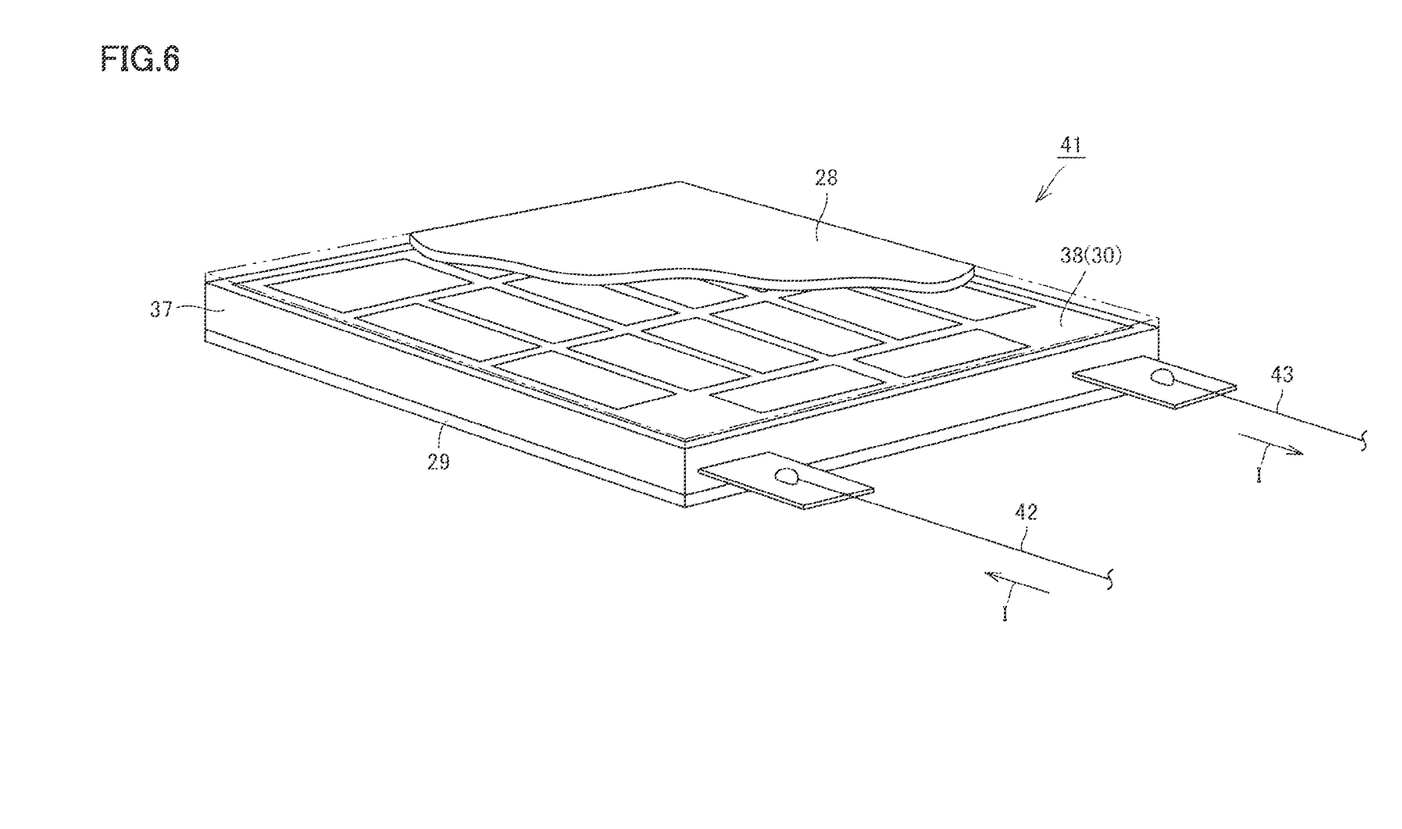
FIG. 6 shows an exemplary structure of a power generation module in a third embodiment.

Sealing portion 30 in each of the above-described embodiments surrounds thermoelectric conversion material portions 22, 23 with region 35 being interposed therebetween; however, it is not limited thereto. The following configuration may be employed. A power generation module 41 in a third embodiment has basically the same configuration and exhibits basically the same effect as those in the second embodiment. However, power generation module 41 of the third embodiment is different from that in the second embodiment in that sealing portion 30 is constituted of a sealing material 38 provided in region 35.

FIG. 6 shows an exemplary structure of the power generation module in the third embodiment. With reference to FIG. 6, the power generation module includes: thermoelectric conversion material portions 22, 23 each composed of a material having a band gap; high temperature side electrodes 24 serving as first electrodes disposed in contact with thermoelectric conversion material portions 22, 23; low temperature side electrodes serving as second electrodes disposed in contact with thermoelectric conversion material portions 22, 23 and disposed to be separated from high temperature side electrodes 24; and sealing portion 30 that seals thermoelectric conversion material portions 22, 23. Sealing portion 30 is composed of sealing material 38 provided in region 35. As sealing material 38, an epoxy resin is selected, for example. Sealing material 38 is provided as follows, for example. That is, frame body 37 is joined onto low temperature side insulator substrate 29 to place low temperature side electrodes 25, 26, thermoelectric conversion material portions 22, 23, and high temperature side electrodes 24 on low temperature side insulator substrate 29. Then, an uncured epoxy resin or the like is provided into gaps among low temperature side electrodes 25, 26, thermoelectric conversion material portions 22, 23, and high temperature side electrodes 24 in region 35. Then, the epoxy resin is cured. In this way, sealing material 38 composed of the cured epoxy resin is provided. It should be noted that in this case, there is no gas around thermoelectric conversion material portions 22, 23 and no oxygen molecules exist. Hence, the partial pressure of oxygen in the region surrounding thermoelectric conversion material portions 22, 23 is 0. That is, in thermoelectric conversion element 21 according to the present application, the substance disposed in region 35 surrounding thermoelectric conversion material portions 22, 23 may be in the form of a gas or in the form of a solid such as sealing material 38. With such a sealing material 38, each of thermoelectric conversion material portions 22, 23 can be suppressed from being brought into contact with oxygen molecules. As a result, oxide films can be suppressed from being formed on the surfaces of the particles of the pressed powder body. Therefore, high efficiency of thermoelectric conversion can be secured by maintaining the state in which the resistivity of each of thermoelectric conversion material portions 22, 23 is low.

Fourth Embodiment

Figure 7:
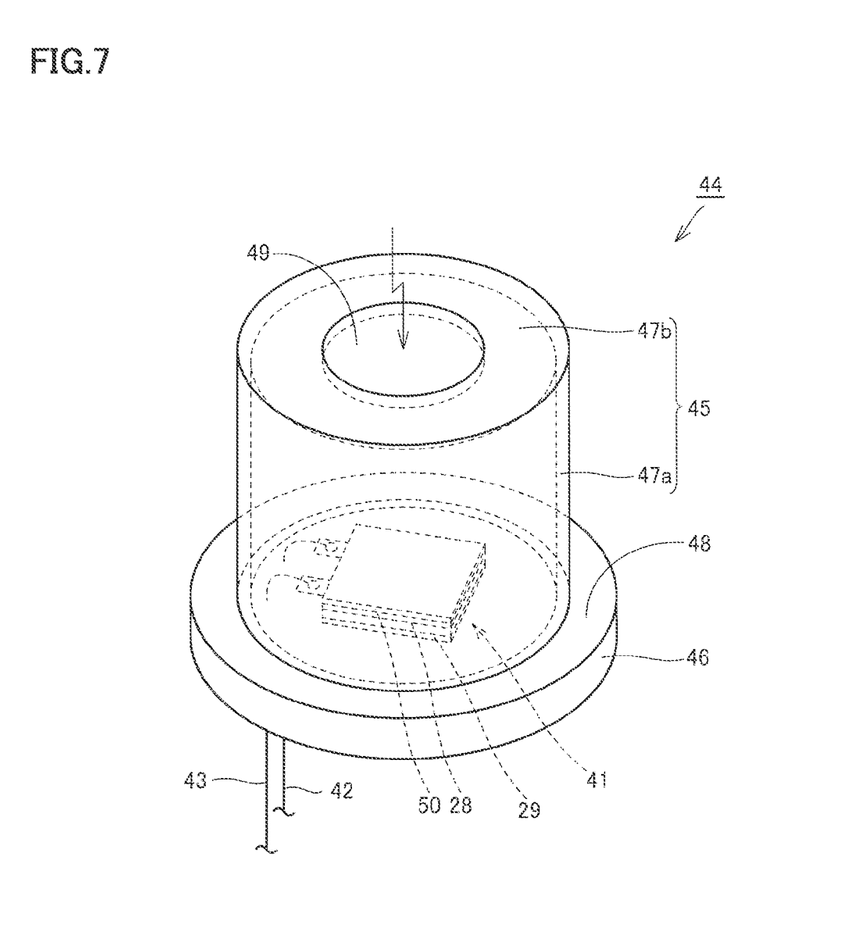
FIG. 7 shows an exemplary structure of an optical sensor.

Next, the following describes an optical sensor as another embodiment employing power generation module 41 according to the second embodiment. FIG. 7 shows an exemplary structure of an optical sensor. With reference to FIG. 7, optical sensor 44 includes: power generation module 41 described above; a cap 45 that covers power generation module 41; and a base 46 having a circular plate shape. Power generation module 41 is attached on one surface 48 of base 46. Cap 45 includes a cylindrical portion 47a and a cover portion 47b that covers an opening of cylindrical portion 47a on one side. Cap 45 is attached on one surface 48 of base 46 to cover power generation module 41. Cover portion 47b is provided with a transparent glass 49 to receive light. Wirings 42, 43 from power generation module 41 extends through base 46 in a plate thickness direction to enable an output to outside. In the present embodiment, power generation module 41 includes an absorber 50 that absorbs optical energy. Absorber 50 is disposed in contact with high temperature side insulator substrate 28 on the surface side facing glass 49. In FIG. 7, absorber 50 is illustrated schematically. High temperature side insulator substrate 28 included in power generation module 41 is connected to absorber 50. That is, high temperature side electrode 24, which is the first electrode included in power generation module 41, is connected to absorber 50 via high temperature side insulator substrate 28.

Light enters cylindrical portion 47a through glass 49 in a direction indicated by an arrow in FIG. 7 and absorber 50 is irradiated with the light in power generation module 41. Here, when absorber 50 of power generation module 41 absorbs optical energy as a result of the irradiation of light, a temperature difference occurs between high temperature side insulator substrate 28 in contact with absorber 50 and low temperature side insulator substrate 29. Due to thermoelectric conversion material portion 22 and thermoelectric conversion material portion 23 connected in series, current flows in the same direction as that in the case of π type thermoelectric conversion element 21.

In optical sensor 44 of the present embodiment, improvement in the efficiency of thermoelectric conversion is attained in thermoelectric conversion element 21. Accordingly, an optical sensor having high sensitivity can be provided.

It should be noted that in the present embodiment, optical sensor 44 employs power generation module 41 shown in FIG. 4; however, it is not limited thereto. The following configuration may be employed. That is, for example, a power generation module 41 including no frame body 37 and having thermoelectric conversion material portions 22, 23 not sealed is placed as shown in FIG. 7. This is sealed using cap 45 and base 46 in a state in which a pressure is more than or equal to $1 \times 10^{-7}$ Pa and less than or equal to $1 \times 10^{-2}$ Pa (vacuum), for example. In this case, cap 45 and base 46 constitute sealing portion 30. That is, thermoelectric conversion element 21 includes cap 45 and base 46 as sealing portion 30. Also in this way, formation of an oxide film on a surface of the material of each of thermoelectric conversion material portions 22, 23 is suppressed as compared with that in the external air, thereby obtaining an optical sensor 44 having high sensitivity.

Moreover, instead of power generation module 41 shown in FIG. 7, optical sensor 44 may employ thermoelectric conversion element 21 shown in FIG. 1 and including the pair of p type and n type thermoelectric conversion material portions 22, 23. In this case, high temperature side electrode 24 is provided with absorber 50 that absorbs optical energy. Then, sealing is performed using cap 45 and base 46 in the state in which the pressure is more than or equal to $1 \times 10^{-7}$ Pa and less than or equal to $1 \times 10^{-2}$ Pa (vacuum). That is, also in this case, thermoelectric conversion element 21 includes cap 45 and base 46 as sealing portion 30. Also in this way, formation of an oxide film on a surface of the material of each of thermoelectric conversion material portions 22, 23 is suppressed as compared with that in the external air, thereby obtaining an optical sensor 44 having high sensitivity.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

21: π type thermoelectric conversion element; 22, 23: thermoelectric conversion material portion; 24: high temperature side electrode; 25, 26: low temperature side electrode; 27, 42, 43: wiring; 28: high temperature side insulator substrate; 29: low temperature side insulator substrate; 30: sealing portion; 31, 32, 33, 34: end portion; 35: region; 36a, 36b, 36c, 36d: arrow; 37: frame body; 38: sealing material; 41: thermoelectric conversion module; 44: optical sensor; 45: cap; 46: base; 47a: cylindrical portion; 47b: cover portion; 48: surface; 49: glass; 50: absorber.

The invention claimed is:

1. A thermoelectric conversion element comprising:
   a thermoelectric conversion material portion composed of a material having a band gap;
   a first electrode disposed in contact with the thermoelectric conversion material portion;
   a second electrode disposed in contact with the thermoelectric conversion material portion and disposed to be separated from the first electrode; and
   a sealing portion that seals the thermoelectric conversion material portion, wherein
   a partial pressure of oxygen in a region surrounding the thermoelectric conversion material portion is maintained by the sealing portion so as to be lower than a partial pressure of oxygen in an external air,
   the thermoelectric conversion material portion is composed of a semiconductor material containing an amorphous material,
   the thermoelectric conversion material portion includes n type thermoelectric conversion material portion in which n type carriers are moved,
   the n type thermoelectric conversion material portion includes Si, Ge, Fe, and P,
   the n type thermoelectric conversion material portion has a resistivity of less than or equal to 10 mΩcm, the resistivity being assessed at room temperature and at a pressure of more than or equal to $1+10^{-7}$ Pa and less than or equal to $1+10^{-2}$ Pa, and
   the n type thermoelectric conversion material portion has a resistivity of more than or equal to 100 mΩcm and less than or equal to 250 mΩcm, the resistivity being assessed at room temperature and in an external air.

2. The thermoelectric conversion element according to claim 1, wherein a pressure in the region is less than or equal to $1 \times 10^{-2}$ Pa.

3. The thermoelectric conversion element according to claim 1, wherein the sealing portion is composed of a sealing material provided in the region.

4. A thermoelectric conversion module comprising a plurality of the thermoelectric conversion elements recited in claim 1.

5. An optical sensor comprising:
   an absorber that absorbs optical energy; and
   the thermoelectric conversion element recited in claim 1, wherein the first electrode is connected to the absorber.

6. The thermoelectric conversion element according to claim 1, wherein the thermoelectric conversion material portion further includes p type thermoelectric conversion material portion in which p type carriers are moved, the p type thermoelectric conversion material portion includes Si, Ge, Au, and B.

7. The thermoelectric conversion element according to claim 1, wherein
   the sealing portion surrounds the thermoelectric conversion material portion with the region being interposed between the sealing portion and the thermoelectric conversion material portion, and
   the partial pressure of oxygen in the region is less than or equal to $2 \times 10^5$ Pa.

8. The thermoelectric conversion element according to claim 7, wherein an inert gas is sealed in the region.

* * * * *

UNITED STATES PATENT AND TRADEMARK OFFICE
CERTIFICATE OF CORRECTION

PATENT NO. : 11,716,903 B2  
APPLICATION NO. : 17/262980  
DATED : August 1, 2023  
INVENTOR(S) : Masahiro Adachi et al.

Page 1 of 1

It is certified that error appears in the above-identified patent and that said Letters Patent is hereby corrected as shown below:

In the Claims

Column 18, Claim 1, Line 12, delete "1+10$^{-7}$ Pa" and insert -- 1×10$^{-7}$ Pa --; and Column 18, Claim 1, Line 13, delete "1+10$^{-2}$ Pa" and insert -- 1×10$^{-2}$ Pa --.

Signed and Sealed this  
Thirty-first Day of October, 2023

Katherine Kelly Vidal  
*Director of the United States Patent and Trademark Office*